United States Patent

[15] 3,643,114
[45] Feb. 15, 1972

Christensen

[54] CLOCKLESS FARMOST TOGGLE FLIP-FLOP CIRCUIT

[72] Inventor: Alton O. Christensen, Houston, Tex.
[73] Assignee: Shell Oil Company, New York, N.Y.
[22] Filed: Mar. 24, 1970
[21] Appl. No.: 22,194

[52] U.S. Cl. ....................307/279
[51] Int. Cl. ....................H03k 3/286
[58] Field of Search ....................307/205, 251, 279, 304

[56] References Cited

UNITED STATES PATENTS

| | | | |
|---|---|---|---|
| 3,523,284 | 8/1970 | Washizuka et al. | 307/279 X |
| 3,406,346 | 10/1968 | Wanlass | 307/304 X |
| 3,431,433 | 3/1969 | Ball et al. | 307/251 X |
| 3,483,400 | 12/1969 | Washizuka et al. | 307/251 X |

*Primary Examiner*—John S. Heyman
*Attorney*—J. H. McCarthy and T. E. Bieber

[57] ABSTRACT

A clockless, ratioless IGFET toggle flip-flop is composed of a FARMOST inverter whose input and output are bridged by the series-connected source-drain circuits of a pair of switching transistors. The gates of the switching transistors are connected, respectively, to the true rail and the complement rail of a double-rail trigger signal source. The true rail is also connected to the clock input of the FARMOST inverter, and the flip-flop output is taken between the two switching transistors. The operation of the circuit involves the transfer of incremental charges between the inverter output capacitance, the flip-flop circuit output capacitance, and the gate capacitance of the inverter input transistor.

2 Claims, 2 Drawing Figures

INVENTOR.
ALTON O. CHRISTENSEN
BY
Mellin, Moore & Weissenberger
ATTORNEYS

CLOCKLESS FARMOST TOGGLE FLIP-FLOP CIRCUIT

BACKGROUND OF THE INVENTION

The MOS (Metal Oxide Silicon) technology used in the miniaturization of computer logic circuitry is based on the use of IGFET (Insulated Gate Field Effect Transistor) switching elements which inherently present a purely capacitive load to the driving circuits which actuate them. Due to the nature of its manufacturing process, MOS circuitry is essentially limited in its component makeup to transistors, diodes and capacitors.

Flip-flop circuits using only these components and designed to feed into a capacitive load have been previously proposed, as for example in the copending application Ser. No. 38303 filed May 18, 1970 and entitled Ratioless Flip-Flop.

Prior art circuits of this type, however, have required a separate supply of clock pulses in addition to the trigger pulses and have required as many as ten elements (such as IGFETS or diodes) to carry out their function. With speed, small area, and low power consumption being essential attributes of MOS circuitry, the prior art devices were consequently relatively inefficient.

SUMMARY OF THE INVENTION

The circuit of this invention provides a greatly simplified toggle flip-flop circuit for MOS circuitry which is markedly superior to prior art circuits of the same type in respect to size, speed of operation, and power consumption. The device of this invention has the superior speed characteristics of a ratioless arrangement, and its power requirements are reduced both by the reduction in the number of devices to be operated and by the elimination of the need for a separate clock pulse supply.

Essentially, the flip-flop of this invention consists of a FARMOST (Fast Acting Ratioless Metal Oxide Silicon Transistor) inverter whose gate and output are connected by the series-connected source-drain circuits of a pair of IGFETs. The gate electrodes of these IGFETs are connected, respectively, to a dual-rail trigger signal source, i.e., a source providing both a trigger signal T and an inverted trigger signal $\overline{T}$. The trigger signal is also applied to the clock input of the FARMOST inverter, and the output of the flip-flop is taken at the junction of the series-connected IGFET source-drain circuits. The operation of the circuit involves a transfer of energy between the line capacitance of the output line of the FARMOST inverter, the gate capacitance of the FARMOST inverter, and the output capacitance of the circuit, the latter being the largest of the three.

It is therefore the object of the invention to provide a simplified toggle flip-flop circuit for capacitive loads using a T signal and a $\overline{T}$ signal as the sole inputs.

It is another object of this invention to accomplish the above result by providing a FARMOST inverter whose gate and output terminals are bridged by a pair of IGFETs whose source-drain circuits are connected in series.

DESCRIPTION OF THE PREFERRED EMBODIMENT

Figure 1:
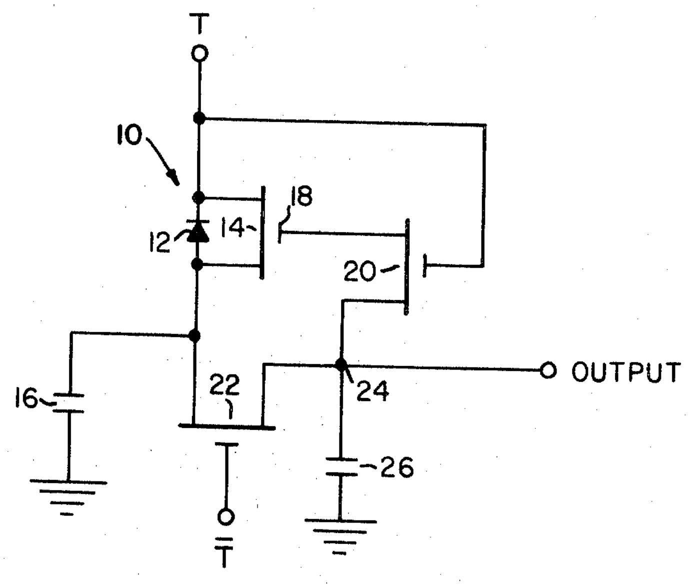
FIG. 1 shows a circuit diagram of a toggle flip-flop circuit in accordance with this invention.
Figure 2:
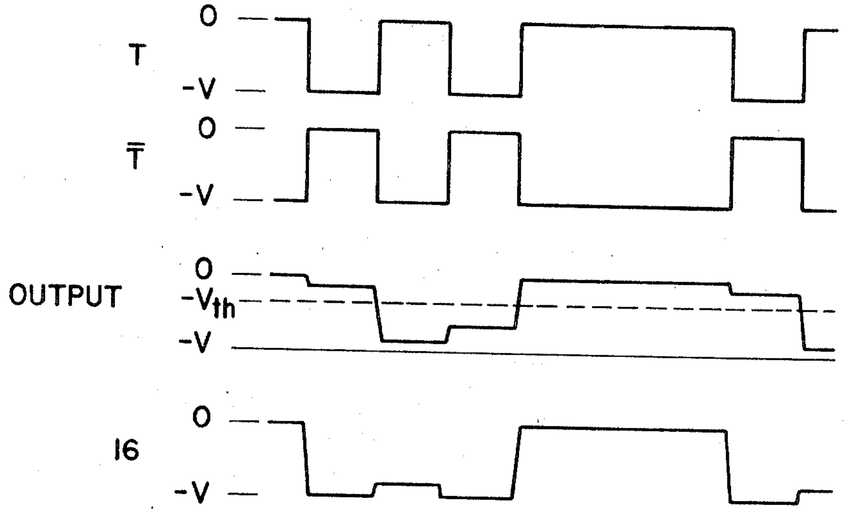
FIG. 2 is a time-amplitude diagram showing the relation of various waveforms involved in the operation of the circuit of FIG. 1.

As shown in FIG. 1, the circuit of this invention includes a FARMOST inverter 10 which may advantageously consist of a diode 12 (preferably a barrier-type diode such as a Shottky diode) and an inverting transistor 14. The clock input of the FARMOST inverter 10 is connected to the true rail of a double-rail source of trigger pulses, and its output feeds into an inverter output capacitance 16. The capacitance 16 may be the line capacitance of the inverter output line. The gate electrode 18 of the inverting transistor 14 is connected to the output of the FARMOST inverter through the series-connected source-drain circuits of switching transistors 20, 22.

The output of the flip-flop circuit is taken at the junction 24 between the source-drain circuits of the switching transistors 20, 22. It will be understood that the flip-flop output has an inherent flip-flop output capacitance 26 which may be the line capacitance of the flip-flop output line, the gate capacitance of the gate electrode of the next following stage, or a combination of both. In any event, it is essential that the total flip-flop output capacitance 26 be larger than the gate capacitance of the gate electrode 18.

The operation of the circuit is as follows:

During the first trigger pulse on the true rail T of the double-rail trigger pulse source, the inverter output capacitance 16 is precharged through the diode 12. At the end of the trigger pulse, $\overline{T}$ returns to ground, the complement rail T of the double-rail trigger pulse source becomes energized and causes a portion of the charge on the inverter output capacitance 16 to be transferred to the flip-flop output capacitance 26. Consequently, if sufficient charge is transferred to bring the flip-flop output capacitance 26 above threshold level $V_{th}$, the flip-flop output will be at logic "1" following the first trigger pulse.

When the next trigger pulse occurs, switching transistor 22 is blocked and switching transistor 20 is enabled by the trigger pulse T. As a result, the negative charge on the flip-flop output capacitance 26 is transmitted through switching transistor 20 to the gate electrode 18 of the inverter transistor 14.

Upon the cessation of the second trigger pulse, the switching transistor 20 is blocked, thus maintaining the inverter transistor 14 in an enabled condition. At the same time, switching transistor 22 is enabled, and the charge on tee flip-flop output capacitance 26 drains off to ground through switching transistor 22 and inverter transistor 14. Simultaneously, the charge imparted to capacitance 16 by the second trigger pulse is drained off through inverter transistor 14.

Upon the occurrence of the third trigger pulse, the enabling of switching transistor 20 causes the charge on the gate electrode 18 to be dissipated into the flip-flop output capacitance 26. It will be seen that the flip-flop output capacitance 26 must be substantially larger than the gate capacitance of gate electrode 18 so that enough charge can dissipate from gate electrode 18 to drop the potential on gate electrode 18 below threshold.

After the cessation of the third trigger pulse, the circuit goes through the same function as after the first trigger pulse. The charge dumped into capacitance 26 from the gate capacitance of gate electrode 18 during the third trigger pulse assists the charging of capacitance 26 from capacitance 16 by raising the initial charge level of capacitance 26 at the beginning of the charge transfer. The cycle will then repeat. It will be noted that the output changes state following the end of each pulse, and that its state will alternate between logic "0" and logic "1".

An advantageous feature of the circuit of this invention is the fact that the spacing between trigger pulses is immaterial to the functioning of the circuit. Once the flip-flop output capacitance 26 has been discharged into the grounded T supply through switching transistor 22 and inverted transistor 14 following the end of an even-numbered trigger pulse, the charge on the gate electrode 18 has fulfilled its purpose, and it does not matter if this charge leaks off during a long interval between trigger pulses. Consequently, the clockless nature of the circuit of this invention provides a considerable saving in drive power for the flip-flop circuit of this invention when the trigger pulses are apaced far apart.

I claim:

1. A clockless, ratioless IGFET toggle flip-flop circuit, comprising:
   a. A double-rail source of complementary trigger pulses;
   b. ratioless IGFET inverter means having a clock input connected to the true rail of said double-rail trigger pulse source, inverter IGFET means, and an inverter output, capacitive means provided between the inverter output and a reference potential, the source-drain circuit of the inverter IGFET means and the capacitive means being connected in series and across the clock input;

c. a flip-flop output, second capacitive means provided between the flip-flop output and reference potential;

d. first switching IGFET means having a source-drain circuit connected between said inverter output and said flip-flop output, and a gate electrode connected to the complement rail of said double-rail trigger pulse source; and e. second switching IGFET means having a source-drain circuit connected between the gate electrode of said inverter IGFET means and said flip-flop output, and a gate electrode connected to said true rail of said double-rail trigger pulse source.

2. The flip-flop circuit of claim 1, in which said flip-flop output coupling capacitance is substantially larger than the gate electrode capacitance of said inverter IGFET.

* * * * *